US008885792B2

(12) United States Patent
Duan et al.

(10) Patent No.: US 8,885,792 B2
(45) Date of Patent: Nov. 11, 2014

(54) SHIFT REGISTER AND ROW-SCAN DRIVING CIRCUIT

(75) Inventors: Liye Duan, Beijing (CN); Zhongyuan Wu, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/476,153

(22) Filed: May 21, 2012

(65) Prior Publication Data

US 2012/0294411 A1 Nov. 22, 2012

(30) Foreign Application Priority Data

May 19, 2011 (CN) .......................... 2011 1 0130441

(51) Int. Cl.
*G11C 19/00* (2006.01)
*G09G 3/32* (2006.01)

(52) U.S. Cl.
CPC ...... *G09G 3/3233* (2013.01); *G09G 2310/0286* (2013.01)
USPC ................................ 377/64; 377/78; 377/79

(58) Field of Classification Search
None
See application file for complete search history.

(56) References Cited

U.S. PATENT DOCUMENTS

| | | | | |
|---|---|---|---|---|
| 6,556,646 | B1 * | 4/2003 | Yeo et al. | 377/54 |
| 6,690,347 | B2 | 2/2004 | Jeon et al. | |
| 6,845,140 | B2 | 1/2005 | Moon et al. | |
| 7,447,292 | B2 * | 11/2008 | Hsu et al. | 377/64 |
| 7,471,122 | B2 * | 12/2008 | Huang et al. | 327/112 |
| 7,679,597 | B2 * | 3/2010 | Shin | 345/100 |
| 7,764,761 | B2 * | 7/2010 | Shih et al. | 377/64 |
| 7,792,237 | B2 * | 9/2010 | Chen et al. | 377/64 |
| 8,107,586 | B2 * | 1/2012 | Shin et al. | 377/64 |
| 8,290,115 | B2 * | 10/2012 | Kim et al. | 377/68 |
| 2005/0185752 | A1 * | 8/2005 | Sasaki et al. | 377/64 |
| 2005/0220263 | A1 * | 10/2005 | Moon | 377/68 |
| 2006/0291610 | A1 * | 12/2006 | Lo et al. | 377/64 |
| 2007/0258557 | A1 * | 11/2007 | Tseng et al. | 377/64 |
| 2008/0062071 | A1 * | 3/2008 | Jeong | 345/46 |
| 2008/0062097 | A1 * | 3/2008 | Jeong et al. | 345/84 |
| 2008/0101529 | A1 * | 5/2008 | Tobita | 377/64 |
| 2011/0058640 | A1 * | 3/2011 | Shang et al. | 377/64 |
| 2012/0112992 | A1 * | 5/2012 | Otose et al. | 345/100 |

* cited by examiner

*Primary Examiner* — Tuan T Lam
(74) *Attorney, Agent, or Firm* — Ladas & Parry LLP

(57) ABSTRACT

The present invention discloses a shift register and a row-scan driving circuit including the same, the shift register comprising a first thin film transistor, a second thin film transistor used as an evaluating transistor, a third thin film transistor, a fourth thin film transistor used as a resetting transistor, a first capacitor and a reset voltage controlling unit, wherein the reset voltage controlling unit is used to control the gate voltage of the fourth thin film transistor, so that the gate voltage of the fourth thin film transistor is pulled down to a low level corresponding to a voltage input from a low voltage signal input when a signal input from a first clock signal input is at low level, a signal input from a second clock signal input is at high level and a signal input from a signal input is at high level.

10 Claims, 8 Drawing Sheets

(a) (Prior Art)

SHIFT REGISTER AND ROW-SCAN DRIVING CIRCUIT

FIELD OF INVENTION

The present invention relates to a panel display technology, in particular to a shift register used for active matrix liquid crystal displays or organic light-emitting diode (OLED) displays, and to a row-scan driving circuit including multi-stages of the shift registers.

BACKGROUND

In active matrix (hereinafter referred as AM) liquid crystal displays (hereinafter referred as LCD) or Organic light emitting diode (hereinafter refereed as OLED) displays, the scan lines in rows cross the data lines in columns to form an active matrix. In practical circuit driving, a progressive scanning method is usually adopted. As AM OLED shown in FIG. 1, the row-scan driving circuit (not shown) sequentially sends row-scan driving signals (Vseli) for various rows to turn on gating transistors of pixels in rows, the data driving circuit (not shown) transfers the voltage on the data lines (Vdataj) into pixel driving transistors and converts it into current for driving the OLED light emitting display.

Usually, the row-scan driving circuit is implemented by cascaded shift registers, with the output of the shift register of each stage being connected to gate transistors of pixels in rows. A shift register can be classified into a dynamic shift register and a static shift register. The structure of the dynamic shift register is relative simple, and needs less number of thin film transistors (TFT); whereas the power consumption is large and the operating frequency band is limited. In contrast, the static shift register has a wider operating band, consumes lower power, and needs more TFT devices. With the dimension of the display panel increasing, the row-scan driving circuit is usually implemented by using the a-Si or p-Si TFT transistors and is produced on the panel directly, which can reduce the interconnection with the peripheral driving circuit, the dimension and the cost. The row-scan driving circuit as designed based on the panel has no requirements on high speed, but requires compact structure and occupying of a small area, so it is mostly implemented by using dynamic shift registers. In addition, it is complex and costly in the process to realize the conventional shift registers adopting PMOS and NMOS transistors, usually requiring 7~9 layer mask plates), and there is a large transient current, and thus the panel based design mostly adopts dynamic circuits which utilize only NMOS or only PMOS transistors. Considering the performance of the shift register, it is to consider the factors of supply voltage, power consumption, reliability and area. With the dimension of the panel gradually increasing, power consumption and reliability have become more important indices of performance parameters. Usually, for sake of material and film thick, the threshold voltage Vths (absolute value) of the transistors based on amorphous silicon and low temperature polysilicon process are high, which makes the supply voltage and power consumption of the shift registers high.

In a row-scan driving circuit, an output of a shift register of each stage is connected to an input of a shift register of next stage, and the shift registers of the individual stage are controlled by an external clock signal line. In the shift register of each stage, when evaluating (i.e. setting) the output, a bootstrapping method using a capacitor is often utilized to avoid threshold loss, and a pull-up transistor is often used to carry out the reset of the output (in the case of PMOS). Since the load of the outputs of shift registers of the stages are large (generally tens of pF), the dimension of the TFT of the driving output is designed relatively large. When evaluating or resetting the output, a resetting transistor and an evaluating transistor are prevented from tuning on at the same time to produce a large transient current. This is because it will not only increase power consumption but also cause function failure. Meanwhile, the threshold loss problem should also be considered in resetting. If the threshold voltage Vth (absolute value) is so large that the threshold loss is too large to reset the shift register; furthermore, after the reset is completed, the output of the shift register unit of each row should be maintained stable at least during one field scanning cycle.

Such as in the U.S. Pat. No. 6,845,140 and U.S. Pat. No. 6,690,347, a shift register controlled by double clocks is employed, and the resetting for an output of the shift register requires being triggered by an output of next shift register. This approach adds the load of the output of each shift register, increases complexity of wiring in designing a layout, and causes the row-scan driving signals from two adjacent rows to overlap because of the delay of the output, or causes the row-scanner on the whole panel to work abnormally as defects occur in the shift register of a certain row. A better approach is that the evaluating and resetting time of the output is precisely controlled by an external clock so as to avoid a malfunction.

Such as in the U.S. Pat. No. 7,679,597, the resetting transistor M5 is automatically turned off by utilizing the feedback transistor M4 connected between the output and the gate of the resetting transistor M5 (as shown in FIG. 2). The principle is as follows: when evaluating, the output is at low and M4 is switched on, at this time CK1 is at high, and M5 is switched off, cutting off the direct current path from the supply voltage VDD; when resetting, CK1 is at low, M3 is turned on and M5 is switched on to charge the output. Although this structure is simple, when resetting, M3 and M5 are to be turned on at the same time, thus there are two threshold losses to be added. Such design either guarantees that VDD voltage is high enough, rendering power consumption larger, or only can be used in a low threshold value process. In fact, the simplest design is to directly control N3 node by CK1 such that one threshold loss can be reduced, but the consequence is to make the output floating during a half of a clock cycle, and thus the ability for resisting interferences deteriorates.

In the product of C0240QGL of CMEL (ChiMei EL Corporation), the driving circuit as shown in FIG. 3A is used, and the timing chart thereof is shown in FIG. 3B. This circuit is controlled by two inverted clocks, with a feedback transistor M5 being connected between the output and VDD. Except that there are two threshold losses added when resetting, there occurs a transient direct current path during evaluating. The large absolute value of the threshold voltage will result long period of strong competition between M1 and M2. If the threshold voltage of M5 is small, when M2 pulls down a small voltage, the balance will be broken. In contrast, if the absolute value of the threshold voltage of M5 is very large, M2 has to pull down at least absolute value of one threshold voltage, the balance can be broken, thus the output varying from high to low; during this period, a considerably large current has occurred, the state of the circuit becomes unreliable.

In summary, there is a problem that threshold voltage loss is large during the period of evaluating or resetting in currently existing shift registers. With a manufacturing process for high threshold voltage TFT, it is likely that such shift registers cannot provide the resetting transistors with low gate voltages enough to make the resetting transistors provide currents large enough, so that the shift register cannot be reset, resulting in the circuit failure. Although the supply voltage VDD of the shift register can be increased, this will make the power consumption of the circuit increase.

SUMMARY

Further scope of applicability of the present invention will become apparent from the detailed description given hereinafter. However, it should be understood that the detailed description and specific examples, while indicating the embodiments of the invention, are given by way of illustration only, since various changes and modifications within the spirit and scope of the invention will become apparent to those skilled in the art from the following detailed description.

In order to solve above mentioned problem, the embodiments of the invention provide a shift register and a row-scan driving circuit including the shift register. The loss of the threshold voltage of the shift register is small, which provides the resetting transistor with a sufficiently low gate voltage during the resetting phase, and thus the resetting transistor can provide a sufficiently large current so that the shift register can operate normally even in a TFT manufacturing process of high threshold voltage.

An embodiment of the invention provides a shift register, comprising: a first thin film transistor having a gate connected to a first clock signal input and a source connected to a signal input; a second thin film transistor, having a gate connected to a drain of the first thin film transistor, a drain connected to a signal output and a source connected to a second clock signal input, wherein a clock signal input from the second clock signal input and a clock signal input from the first clock signal input are inverted to each other; a third thin film transistor, having a gate connected to the drain of the first thin film transistor, a source connected to a high voltage signal input, and a drain connected to a reset voltage controlling unit; a fourth thin film transistor, having a gate connected to a connection point of the drain of the third thin film transistor and the reset voltage controlling unit, a source connected to the high voltage signal input, and a drain connected to the signal output; a first capacitor, being connected between the signal output and the gate of the second thin film transistor; and a reset voltage controlling unit, being connected to a low voltage signal input, the gate of the fourth thin film transistor and the drain of the third thin film transistor, for controlling the gate voltage of the fourth thin film transistor, so that the gate voltage of the fourth thin film transistor is pulled down to a low level corresponding to a voltage input from the low voltage signal input when the signal input from the first clock signal input is at low level, the signal input from the second clock signal input is at high level and the signal input from the signal input is at high level.

The invention further provides a row-scan driving circuit, comprises a plurality of cascaded shift registers, a signal input of the first shift register being connected to an initial pulse signal output, a signal input of each of other shift registers being connected to a signal output of the shift register of the preceding stage, the clock signals input from the first clock signal inputs of two adjacent shift registers being inverted to each other, the clock signals input from the second clock signal inputs of the two adjacent shift registers are inverted to each other; wherein each shift register comprises: a first thin film transistor, having a gate connected to the first clock signal input, and a source connected to the signal input; a second thin film transistor, having a gate connected to the drain of the first thin film transistor, a drain connected to the signal output and a source connected to the second clock signal input, wherein a clock signal input from the second clock signal input and a clock signal input from the first clock signal input are inverted to each other; a third thin film transistor, having a gate connected to the drain of the first thin film transistor, a source connected to a high voltage signal input, and a drain connected to a reset voltage controlling unit; a fourth thin film transistor, having a gate connected to connection point of the drain of the third thin film transistor and the reset voltage controlling unit, a source connected to a high voltage signal input, and a drain connected to the signal output; a first capacitor, being connected between the signal output and the gate of the second thin film transistor; and a reset voltage controlling unit, being connected to a low voltage signal input, the gate of the fourth thin film transistor and the drain of the third thin film transistor respectively, for controlling the gate voltage of the fourth thin film transistor, so that the gate voltage of the fourth thin film transistor is pulled down to a low level corresponding to a voltage input from the low voltage signal input when the signal input from the first clock signal input is at low level, the signal input from the second clock signal input is at high level and the signal input from the signal input is at high level.

In one example, the reset voltage controlling unit comprises: a fifth thin film transistor, having a gate connected to a charge pump unit, a source connected to the drain of the third thin film transistor and the gate of the fourth thin film transistor respectively, a drain connected to the low voltage signal input; and the charge pump unit, being connected to the gate of the fifth thin film transistor and the low voltage signal input, for dropping the gate voltage of the fifth thin film transistor to such a low voltage during a predetermined period that the gate voltage of the fourth thin film transistor can be pulled down to a low level corresponding to a voltage input from the low voltage signal input by the fifth thin film transistor when the signal input from the first clock signal input is at low level, the signal input from the second clock signal input is at high level and the signal input from the signal input is at high level.

In another example, the charge pump unit comprises: a sixth thin film transistor, having a drain connected to the low voltage signal input, a gate connected to the drain thereof, and a source connected to the gate of the fifth thin film transistor; and a seventh thin film transistor, having a gate connected to the gate of the fifth thin film transistor and the source of the sixth thin film transistor respectively, a drain connected to the first clock signal input, and a source connected to the drain thereof.

In one example, the width to length ratio of channel of the fifth thin film transistor is much smaller than that of the third thin film transistor.

In another example, the first capacitor is omitted in the case that the dimension of the second thin film transistor is so large that the parasitic capacitance of the second thin film transistor is sufficient to maintain the gate voltage thereof.

In still another example, all the thin film transistors are p-type thin film transistors which are turned on at low level or N-type thin film transistors which are turned on at high level.

The shift register of the embodiment of the invention can provide the resetting transistor with a sufficient low gate voltage during the resetting phase, which can not only guarantee that the resetting transistor can provide a sufficient large current during the resetting phase so as to complete the resetting in a short period, but also guarantee that a stable high level is output during the whole field scanning cycle. Therefore, compared to the existing shift registers, the shift register provided by the embodiment of the invention can decrease the supply voltage appropriately, and is more properly used in the TFT manufacturing process of high threshold voltage (absolute value).

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The embodiments of the present invention will be described below in connection of the drawings as following.

Figure 1:
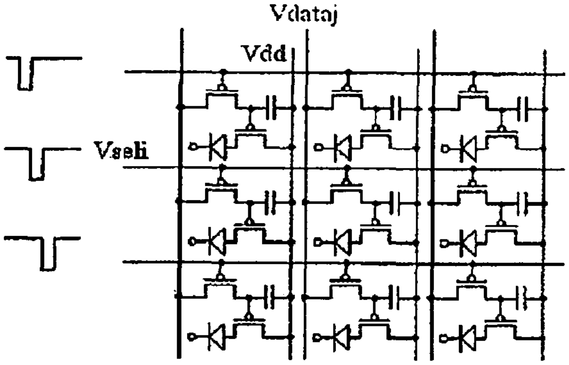
Figure 1 (Prior Art)
FIG. 1 is a structure diagram of an active matrix OLED in the prior art.
Figure 2:
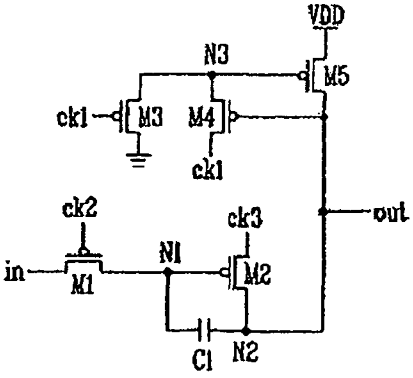
Figure 2 (Prior Art)
FIG. 2 is a circuit diagram of the shift register disclosed in U.S. Pat. No. 7,679,597.
Figure 3:
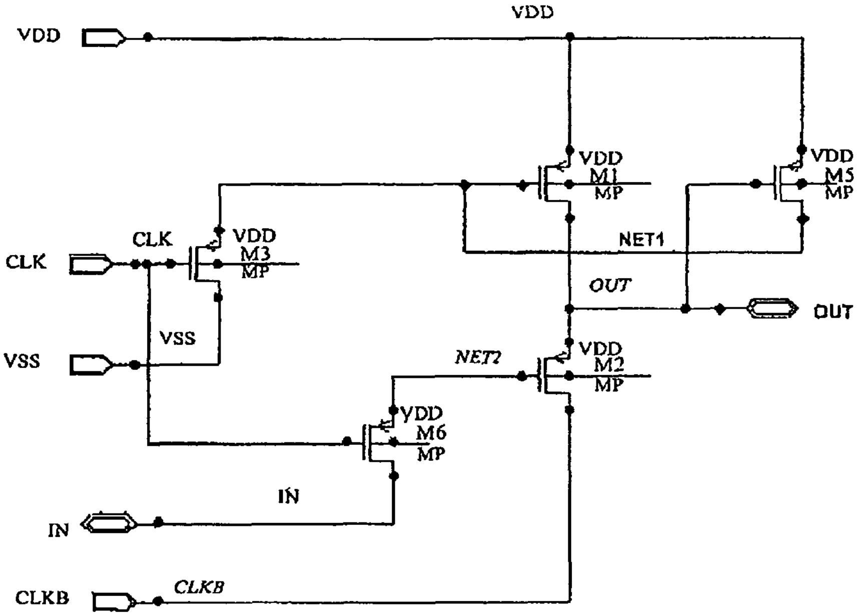
Figure 3 (Prior Art)
FIGS. 3A and 3B are a circuit diagram and a timing diagram of the shift register of the product C0240QGL respectively.
Figure 3:
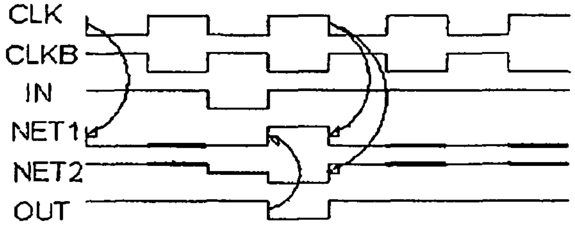
Figure 3 (Prior Art)
Figure 4:
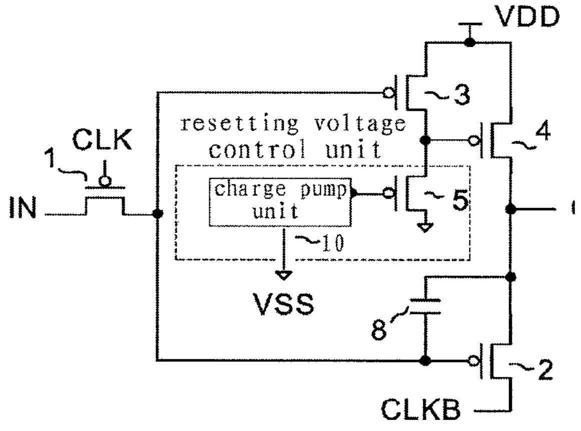
FIG. 4 is an exemplary structure diagram of a shift register of an embodiment of the invention.

FIG. 4 is an exemplary structure diagram of a shift register of an embodiment of the invention. As shown in FIG. 4, the shift register includes a first thin film transistor 1, a second thin film transistor 2, a third thin film transistor 3, a fourth thin film transistor 4, a first capacitor 8 and a reset voltage controlling unit.

For example, the first thin film transistor 1 has a gate connected with a first clock signal input (CLK), a source connected to a signal input (IN). The second thin film transistor 2 is an evaluating transistor which has a gate connected to a drain of the first thin film transistor 1, a drain connected to a signal output (OUT), and a source connected with a second clock signal input (CLKB), wherein a clock signal input from the second clock signal input (CLKB) and a clock signal input from the first clock signal input are inverted to each other. The third thin film transistor 3 has a gate connected with the drain of the first thin film transistor 1, a source connected with high voltage signal input (VDD), and a drain connected with a reset voltage controlling unit. The fourth thin film transistor 4 is a resetting transistor which has a gate connected to a connection point of the drain of the third thin film transistor and the reset voltage controlling unit, a source connected to the high voltage signal input (VDD), and a drain connected to the signal output (OUT). A first capacitor 8 is connected between the signal output (OUT) and the gate of the second thin film transistor 2. The reset voltage controlling unit is connected to a low voltage signal input (VSS), the gate of the fourth thin film transistor 4, the drain of the third thin film transistor 3 respectively, for controlling the gate voltage of the fourth thin film transistor 4, so that the gate voltage of the fourth thin film transistor 4 is pulled down to a low level corresponding to the voltage input from the low voltage signal input (VSS) when the signal input from the first clock signal input (CLK) is at low level, the signal input from the second clock signal input (CLKB) is at high level, and the signal input from the signal input (IN) is at high level.

As shown in FIG. 4, the reset voltage controlling unit further comprises a fifth thin film transistor 5 and a charge pump unit 10. The fifth thin film transistor 5 has a gate connected to the charge pump unit 10, a source connected to the drain of the third thin film transistor 3 and the gate of the fourth thin film transistor 4 respectively, and a drain connected to the low voltage signal input (VSS). The charge pump unit 10 is connected to the gate of the fifth thin film transistor 5 and the low voltage signal input (VSS), for lowering the gate voltage of the fifth thin film transistor 5 during a predetermined time so that the gate voltage of the fourth thin film transistor 4 is pulled down to a low level corresponding to the voltage input from the low voltage signal input (VSS) by the fifth thin film transistor 5 when the signal input from the first clock signal input (CLK) is at low level, the signal input from the second clock signal input (CLKB) is at high level and the signal input from the signal input (IN) is at high level. In other words, a lower resetting voltage is obtained by the method using a charge pump, so that the shift register can operate normally even in the TFT manufacturing process of high threshold voltage. In an actual circuit working process, the fifth thin film transistor 5 operates in a linear region, which is equal to a resistor.

Figure 5A:
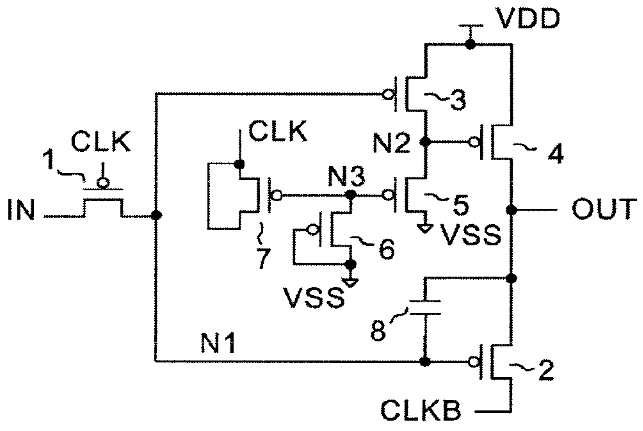
FIGS. 5A and 5B are an exemplary circuit diagram and a timing diagram of a shift register of an embodiment of the invention respectively.

FIG. 5A shows an implemented structure of the charge pump unit 10. As shown in FIG. 5*a*, the charge pump unit 10 includes a sixth thin film transistor 6 and a seventh thin film transistor 7. The sixth thin film transistor 6 is connected in form of a diode, in particularly, having a drain connected to the low voltage signal input (VSS), a gate connected to the drain thereof and a source connected to the gate of the fifth thin film transistor 5. A seventh thin film transistor 7 is connected to form a MOS capacitor, in particular, having a gate connected to the gate of the fifth thin film transistor 5 and the source of the sixth thin film transistor 6 respectively, a drain connected to the first clock signal input (CLK) and a source connected to its drain.

As indicated herein, in this embodiment, the thin film transistors from the first thin film transistor 1 to the seventh thin film transistor 7 are all turned on by a low level, and turned off by a high level. The first thin film transistor 1, the second thin film transistor 2, the third thin film transistor 3, and the fourth thin film transistor 4 operates in a switching state; the fifth thin film transistor 5 operates in a linear region, which is equal a resistor; the sixth thin film transistor 6 is connected in form of a diode, and the seventh thin film transistor 7 is connected to form a MOS capacitor.

Figure 5B:
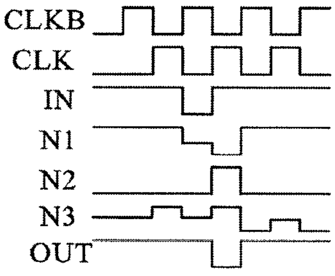

FIG. 5B is a timing diagram of the circuit diagram shown in FIG. 5A.

As shown in FIG. 5B, the inputs of CLK and CLKB are both at low level in the initial state; when the input IN is at high level, the first thin film transistor 1 is turned on, the second thin film transistor 2 and the third thin film transistor 3 are turned off, and an internal node N1 is at high level, and a node N3 is at low level; if the threshold voltage is relatively high, a node N2 is temporarily in an uncertain state. With a clock coming, positive charges are introduced to VSS by the sixth thin film transistor 6 connected in form of a diode, the minimum of N3 is about at 2VSS−VDD+Vth, N3 changes to a low level, the fourth thin film transistor 4 outputs a high level, and the initialization of the shift register is completed.

When CLK is at low, CLKB is at high and IN is at high level, the first thin film transistor 1 and the fourth thin film transistor 4 are turned on, the second thin film transistor 2 and the third thin film transistor 3 are turned off, the internal node N1 is at high level, N2 and N3 are at low level, and a high level is output.

When CLK is at high, CLKB is at low and IN is at high, the fourth thin film transistor 4 is turned on, the first thin film transistor 1, the second thin film transistor 2 and the third thin film transistor 3 are turned off, the internal node N1 is at high level, N2 and N3 are at low level, and a high level is output.

When CLK is at low level, CLKB is at high level, and IN is at low level, it is in a pre-charging phase of the shift register. At this time, the first thin film transistor 1 is turned on, and a low level is transferred to the node N1 to charge the first capacitor 8.

When CLK is at high, CLKB is at low and IN is at high, it is in the evaluating phase of the shift register; at this time, the first thin film transistor 1 is turned off, the node N1 is floating; Now, CLKB changes to a low level, the voltage difference stored across two ends of the first capacitor 8 during the pre-charging phase drops the voltage at the node N1, which turns on the second thin film transistor 2 fully, transferring a low level without threshold loss. Meanwhile, after CLKB changes to low, the third thin film transistor 3 is turned on, the node N2 is pulled up to a high level, and the fourth thin film transistor 4 is turned off, cutting off the direct current path from VDD.

Next, when CLK is at low, CLKB is at high, and IN is at high, it is the resetting phase of the shift register; at this time, the first thin film transistor 1 is turned on, the node N1 is charged to a high level, the second thin film transistor 2 and the third thin film transistor 3 are turned off, and N2 is pulled down to a low level VSS by the fifth thin film transistor 5 which operates in a linear region and is equal to a resistor, so that the fourth thin film transistor 4 is turned on, charging the signal output OUT to a high level.

Finally, when CLK is at high, CLK is at low and IN is at high, the first thin film transistor 1 is turned off, the node N1 is maintained at high level, the second thin film transistor 2 and the third thin film transistor 3 are both turned off, and the node N2 is maintained at low level, the fourth thin film transistor 4 is turned on, and the output is maintained at high.

The main feature of this solution is to add the fifth thin film transistor 5 which operates in a linear region and thus is equal to a resistor, the sixth thin film transistor 6 connected in form of a diode, and the seventh thin film transistor 7 equal to a MOS capacitor. The sixth thin film transistor 6 and the seventh thin film transistor 7 constitute a simple charge pump, and the gate and the source/drain of the seventh thin film transistor 7 form a capacitor; when the rising edge of CLK is coming, the sixth thin film transistor 6 connected in form of a diode clamps the node N3 to VSS+Vth, while when the falling edge of CLK is coming, the node N3 is at low voltage of about 2VSS−VDD+Vth to drop the node N2 to VSS. As a result, it not only guarantees that the fourth thin film transistor 4 can provide sufficient current during the resetting phase, but also guarantees that the output during the whole field scanning period is at a stable high level.

In addition, if there is no the simple charge pump constituted by the sixth thin film transistor 6 and the seventh thin film transistor 7, and a resetting signal is applied to the node N3 directly, the node N2 cannot be dropped to the VSS and is a threshold voltage of the fifth thin film transistor 5 higher than the VSS since the threshold voltage of the fifth thin film transistor 5 exists, which results in a threshold loss. In contrast, in the embodiment of the invention, since the evaluating port employs the first capacitor 8 so that the voltage of the node N1 drops and the evaluating transistor 2 is turned on fully during the evaluating phase to avoid the threshold loss; since the resetting port employs the simple charge pump constituted by the sixth thin film transistor 6 and the seventh thin film transistor 7 so that the node N2 drops to VSS and the reset transistor 4 is turned on fully during resetting phase to avoid threshold loss.

In addition, the dependency on the high supply voltage can be reduced by employing this solution. In U.S. Pat. No. 7,679,597 and product C0240QGL, the theoretically worst case is |Vth|=(VDD−VSS)/2; at this time the evaluating phase is still in working. This is because the load of the input transistor is relatively small, the charge of the capacitor can still be completed, and the output pulling down transistor can also be guaranteed to turn on completely under the influence of the falling edge of CLKB and the parasitic capacitance Cgd. In resetting phase, it is necessary for the output pulling down transistor to provide a large current, but at this time since there is a double threshold voltage loss, and the over-driving voltage is 0, it is impossible to provide the large current, which causes circuit failure. In fact, since there is a parasitic capacitance and a leaking current, before the VDD−VSS drops to 2|Vth|, the circuit has been in failure. But in the shift register circuit of the embodiment of the invention, the sixth thin film transistor 6 and the seventh thin film transistor 7 constitute a simple charge pump, which makes the node N3 get a low voltage about 2VSS−VDD+Vth during a certain period; even when the VDD−VSS is not reduced to 2|Vth|, the node N2 can still be reduced to VSS, which guarantees that the fourth thin film transistor 4 can provide a sufficient current during the resetting phase, to ensure the resetting to be completed during a short period.

As indicated herein, in the shift register circuit of the embodiment of the invention, W/L of the fifth thin film transistor 5 is much smaller than the W/L of the third thin film transistor 3, to guarantee that the voltage at the node N2 can be pulled up sufficiently during the evaluating phase, guaranteeing the fourth thin film transistor 4 in off state.

In addition, in the embodiment of the invention, the first capacitor 8 can be substituted by the parasitic capacitance of the second thin film transistor 2 to perform the same function, premised that the dimension of the second thin film transistor 2 is so large that the Cgd is big enough to maintain the voltage at the node N1 during one field scanning cycle. As a result, this can further save the area.

In above embodiments, it can be achieved by P-type thin film transistors (TFTs) which are turned on at low level, whereas the embodiments of the invention can be implemented by N-type TFTs which are turned on at high level.

Figure 8:
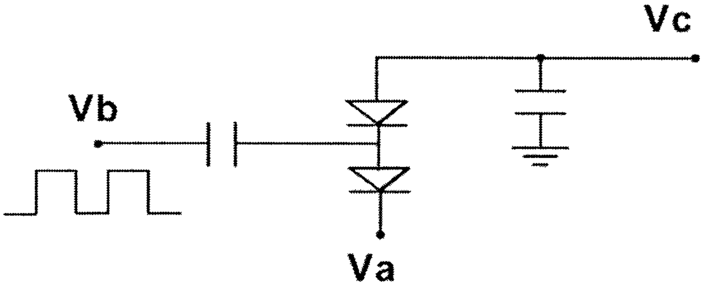
FIG. 8 is a structure diagram of a general charge pump can be utilized in an embodiment of the invention.

Besides the above-mentioned structures, the charge pump unit of the embodiment of the invention also can be substituted by a general charge pump structure. A general charge pump is shown in FIG. 8, wherein when used in the embodiment of the invention, Va is connected to VSS shown in FIG. 5A, Vb is connected to CLK shown in FIG. 5A and Vc is connected to N3 shown in FIG. 5A.

Figure 6A:
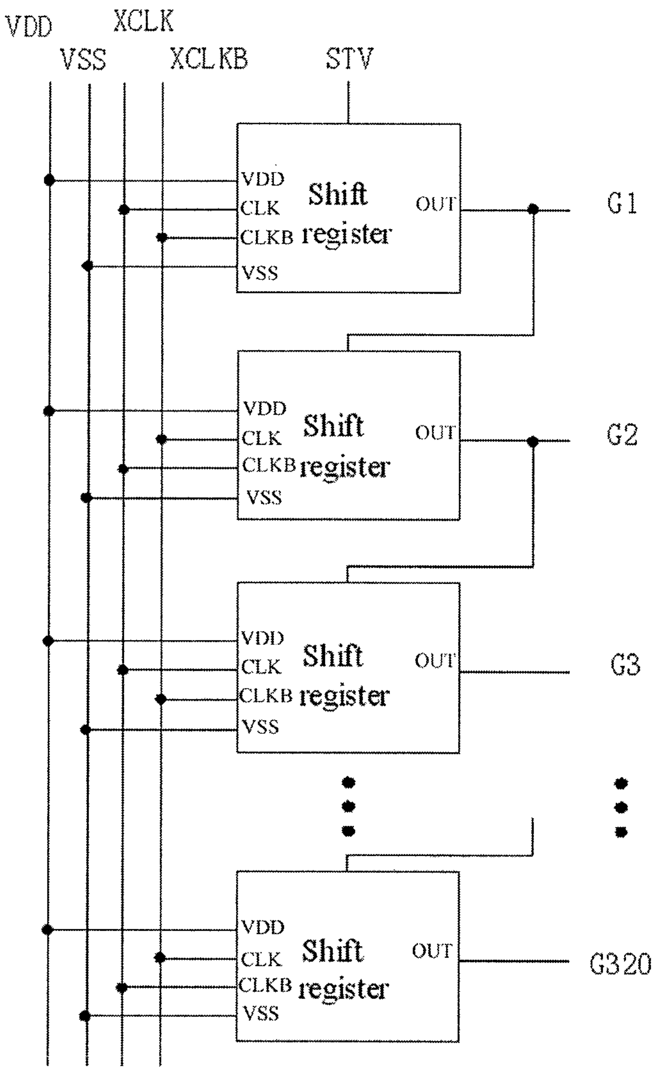
FIGS. 6A and 6B are a structure diagram and a timing diagram of a row-scan driving circuit of an embodiment of the invention respectively.
Figure 6B:
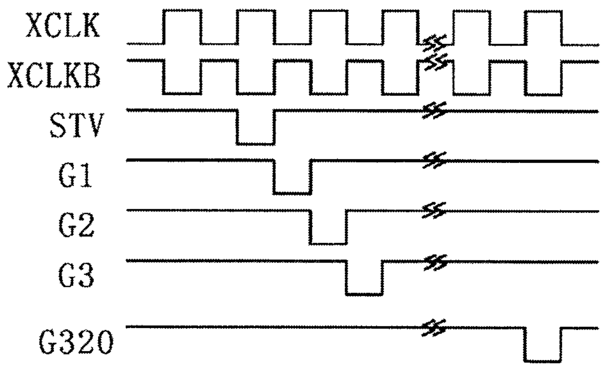

FIG. 6A is a structure diagram of row-scan driving circuit employing above-mentioned shift register according to the embodiment of the invention. As shown in FIG. 6A, the row-scan driving circuit comprises N cascaded shift registers, N usually being the row number of the active matrix. The inputs from the first clock signal input (CLK) and the second clock signal input (CLKB) of each shift register are clock signals XCLK, XCLB respectively which are inverted to each other and have a duty ratio of 50%, with a high level signal VDD being input into a high voltage signal input (VDD), and a low level signal VSS being input into a low voltage signal input (VSS); wherein an initial pulse signal (STV) (which is active at low level) is input into a signal input (IN) of the first shift register, the signal inputs (IN) of the other shift registers are connected to the signal output (OUT) of the shift register of the preceding stage respectively; furthermore, the clock signals input from the first clock signal inputs of two adjacent shift registers are inverted to each other, and the clock signals input from the second clock signal inputs of the two adjacent shift registers are inverted to each other. For example, the CLK input and the CLKB input of the first shift register are connected to an external clock XCLK and an external clock XCLB respectively, and the CLK input and the CLKB input of the adjacent second shift register are connected to the external clock XCLKB and the external clock XCLK respectively.

Figure 7A:
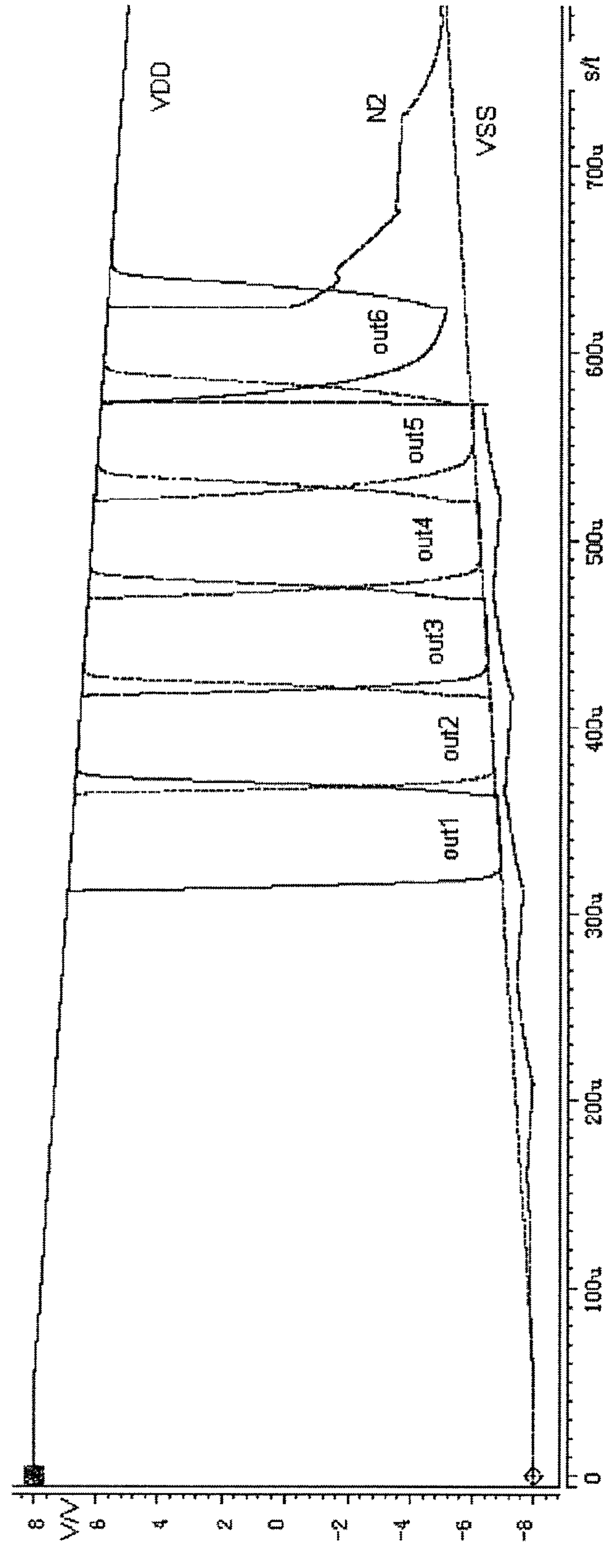
FIGS. 7A to 7C are the curve diagrams of the simulated output voltages and internal node voltages of the row-scan driving circuit shown in FIG. 5A the row-scan driving circuit disclosed in U.S. Pat. No. 7,679,597 and the row-scan driving circuit of the product C0240QGL.
Figure 7B:
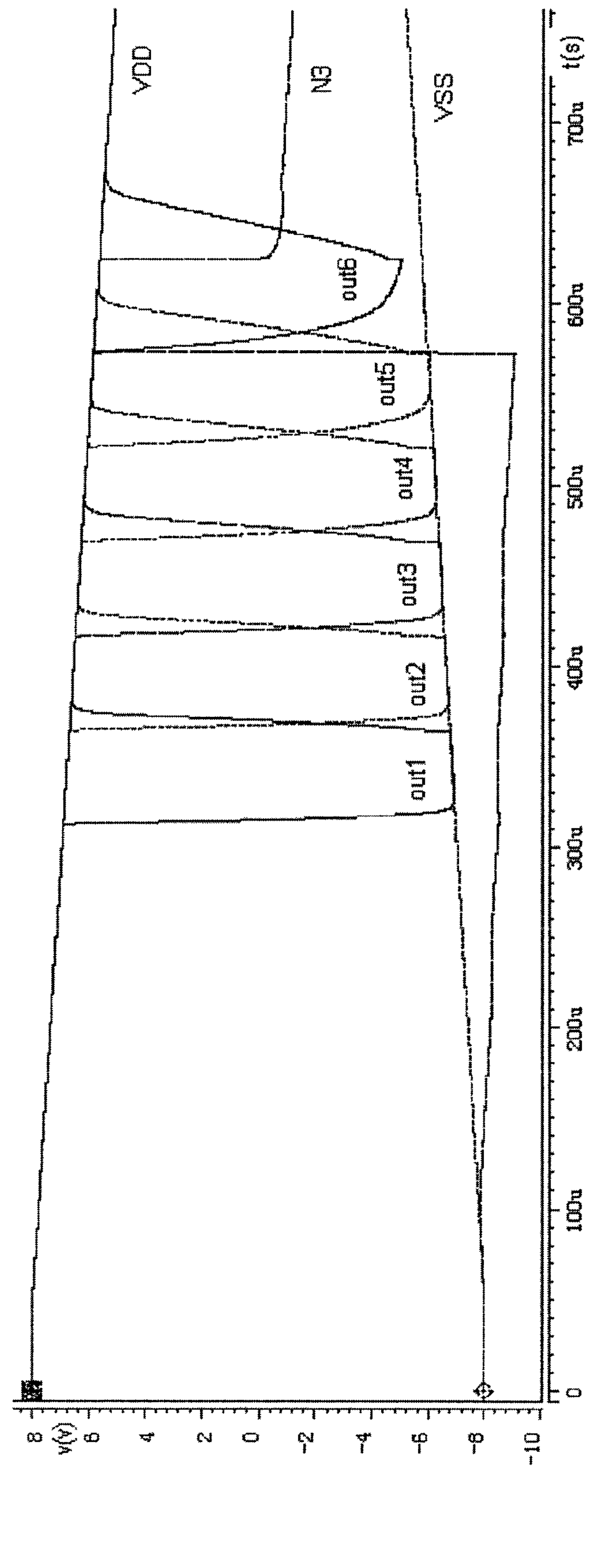
Figure 7C:
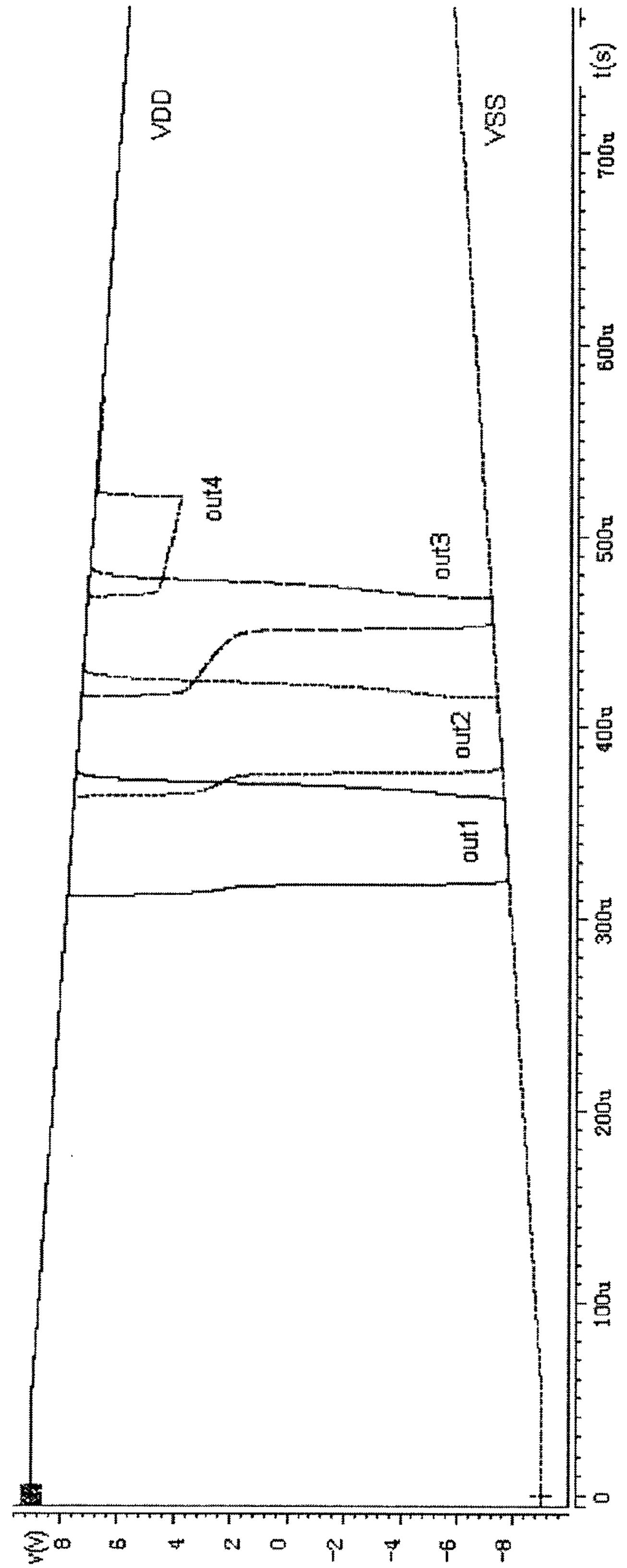

FIGS. 7A to 7C show the curves of the simulated output voltages and the internal node voltages of the row-scan driving circuit of the embodiment of the invention, the row-scan driving circuit disclosed in U.S. Pat. No. 7,679,597 and the row-scan driving circuit of product C0240QGL (these three circuits are all based on a P-Si process of Vth=0.5~0.7V), wherein, symbols "out 1" to "out 6" represent the outputs from the first shift register to the sixth shift register respectively. From contrasting FIG. 7A to FIG. 7C, it can be found that the inactive supply voltage of the shift register as designed according to the embodiment of the invention can be reached to VDD=6V, VSS=−6V, whereas the inactive supply voltage of the shift register of the U.S. Pat. No. 7,679,597 based on the same process is close to that of the embodiment of the invention, but the rising edge of the output is obviously slower, and the difference in between is 12 us; the inactive supply voltage of the shift register of product C0240QGL is 8V. This means, if the same manufacturing process is employed, the embodiment of the invention can properly reduce the supply voltage to save power consumption; and if they operate in the same supply voltage, the circuit of the embodiment of the invention is more suitable for the TFT manufacturing process of high threshold voltage (absolute value) than the two above-mentioned circuits.

Though the embodiments of the invention are described above in detail, it will be appreciated that the invention is not limited to the above embodiments in any way. Any variations are not to be regarded as a departure from the spirit and scope of the invention, and all such modifications as would be obvious to those skilled in the art are intended to be included within the scope of the following claims.

What is claimed is:

1. A shift register, comprising:

a first thin film transistor, having a gate connected to a first clock signal input, and a source connected to a signal input;

a second thin film transistor, having a gate connected to a drain of the first thin film transistor, a drain connected to a signal output, and a source connected to a second clock signal input, wherein a clock signal input from the second clock signal input and a clock signal input from the first clock signal input are inverted to each other;

a third thin film transistor, having a gate connected to the drain of the first thin film transistor, a source connected to a high voltage signal input, and a drain connected to a reset voltage controlling unit;

a fourth thin film transistor, having a gate connected to a connection point of the drain of the third thin film transistor and the reset voltage controlling unit, a source connected to the high voltage signal input, and a drain connected to the signal output;

a first capacitor, being connected between the signal output and the gate of the second thin film transistor; and the reset voltage controlling unit, being connected to a low voltage signal input, the gate of the fourth thin film transistor and the drain of the third thin film transistor, controlling the gate voltage of the fourth thin film transistor, so that the gate voltage of the fourth thin film transistor is pulled down to a low level corresponding to a voltage input from the low voltage signal input when the signal input from the first clock signal input is at low level, the signal input from the second clock signal input is at high level and the signal input from the signal input is at high level, and wherein the reset voltage controlling unit comprises:

a fifth thin film transistor, having a gate connected to a charge pump unit, a source connected to the drain of the third thin film transistor and the gate of the fourth thin film transistor respectively, a drain connected to the low voltage signal input; and the charge pump unit, being connected to the gate of the fifth thin film transistor and the low voltage signal input, dropping the gate voltage of the fifth thin film transistor to such a voltage during a predetermined period, said voltage enables the gate voltage of the fourth thin film transistor to be pulled down by the fifth thin film transistor to a low level corresponding to a voltage input from the low voltage signal input when the signal input from the first clock signal input is at low level, the signal input from the second clock signal input is at high level and the signal input from the signal input is at high level.

2. The shift register of claim 1, the charge pump unit comprises:

a sixth thin film transistor, having a drain connected to the low voltage signal input, a gate connected to the drain thereof, and a source connected to the gate of the fifth thin film transistor; and a seventh thin film transistor, having a gate connected to the gate of the fifth thin film transistor and the source of the sixth thin film transistor respectively, and a drain connected to the first clock signal input, and a source being connected to the drain thereof.

3. The shift transistor of claim 1, the width to length ratio of channel of the fifth thin film transistor is much smaller than that of the third thin film transistor.

4. The shift transistor of claim 1, the first capacitor is omitted in the case that the dimension of the second thin film transistor is so large that the parasitic capacitance of the second thin film transistor is sufficient to maintain the gate voltage thereof.

5. The shift register of claim 2, all the thin film transistors are p-type thin film transistors which are turned on at low level or N-type thin film transistors which are turned on at high level.

6. A row-scan driving circuit, comprises a plurality of cascaded shift registers, wherein a signal input of a first shift register is connected to an initial pulse signal output, a signal input of each of other shift registers is connected to a signal output of the shift register of the preceding stage, the clock signals input from the first clock signal inputs of two adjacent shift registers are inverted to each other, and the clock signals input from the second clock signal inputs of the two adjacent shift registers are inverted to each other; wherein each shift register comprises:

a first thin film transistor, having a gate connected to the first clock signal input, and a source connected to the signal input;

a second thin film transistor, having a gate connected to a drain of the first thin film transistor, a drain connected to the signal output and a source connected to the second clock signal input, wherein a clock signal input from the second clock signal input and a clock signal input from the first clock signal input are inverted to each other;

a third thin film transistor, having a gate connected to the drain of the first thin film transistor, a source connected to a high voltage signal input, and a drain connected to a reset voltage controlling unit;

a fourth thin film transistor, having a gate connected to a connection point of the drain of the third thin film transistor and the reset voltage controlling unit, a source connected to the high voltage signal input, and a drain connected to the signal output;

a first capacitor, being connected between the signal output and the gate of the second thin film transistor; and the reset voltage controlling unit being connected to a low voltage signal input, the gate of the fourth thin film transistor and the drain of the third thin film transistor respectively, controlling the gate voltage of the fourth thin film transistor, so that the gate voltage of the fourth thin film transistor is pulled down to a low level corresponding to a voltage input form the low voltage signal input when the signal input from the first clock signal input is at low level, the signal input from the second clock signal input is at high level and the signal input from the signal input is at high level, and wherein the reset voltage controlling unit comprises:

a fifth thin film transistor, having a gate connected to the charge pump unit, a source connected to the drain of the third thin film transistor and the gate of the fourth thin film transistor respectively, a drain connected to the low voltage signal input; and a charge pump unit, being connected to the gate of the fifth thin film transistor and the low voltage signal input, dropping the gate voltage of the fifth thin film transistor to such a voltage during a predetermined period, said voltage enables the gate voltage of the fourth thin film transistor to be pulled down by the fifth thin film transistor to a low level corresponding to a voltage input from the low voltage signal input when the signal input from the first clock signal input is at low level, the signal input from the second clock signal input is at high level and the signal input from the signal input is at high level.

7. The row-scan driving circuit of claim 6, the charge pump unit comprises:

a sixth thin film transistor, having a drain connected to the low voltage signal input, a gate connected to the drain thereof, and a source connected to the gate of the fifth thin film transistor; and a seventh thin film transistor, having a gate connected to the gate of the fifth thin film transistor and the source of the sixth thin film transistor respectively, and a drain connected to the first clock signal input, a source connected to the drain thereof.

8. The row-scan driving circuit of claim 6, the width to length ratio of channel of the fifth thin film transistor is much smaller than that of the third thin film transistor.

9. The row-scan driving circuit of claim 6, wherein the first capacitor is omitted in the case that the dimension of the second thin film transistor is so large that the parasitic capacitance of the second thin film transistor is sufficient to maintain the gate voltage thereof.

10. The row-scan driving circuit of claim 7, all the thin film transistors are p-type thin film transistors which are turned on at low level or N-type thin film transistors which are turned on at high level.

* * * * *